Dec. 28, 1965 LA VAR E. WHITTLE 3,226,575

PULSE SHAPER CIRCUIT EMPLOYING OPPOSITELY POLED SERIES CONNECTED TUNNEL DIODES IN BASE CIRCUIT OF TRANSISTOR

Filed Sept. 30, 1963

INVENTOR.

LAVAR E. WHITTLE

BY HIS ATTORNEYS

HARRIS, KIECH, RUSSELL & KERN

United States Patent Office 3,226,575 Patented Dec. 28, 1965

3,226,575

PULSE SHAPER CIRCUIT EMPLOYING OPPOSITELY POLED SERIES CONNECTED TUNNEL DIODES IN BASE CIRCUIT OF TRANSISTOR

La Var E. Whittle, Granada Hills, Calif., assignor to Pacific Industries, Inc., San Fernando, Calif., a corporation of California Filed Sept. 30, 1963, Ser. No. 312,373
6 Claims. (Cl. 307—88.5)

Figure 1:
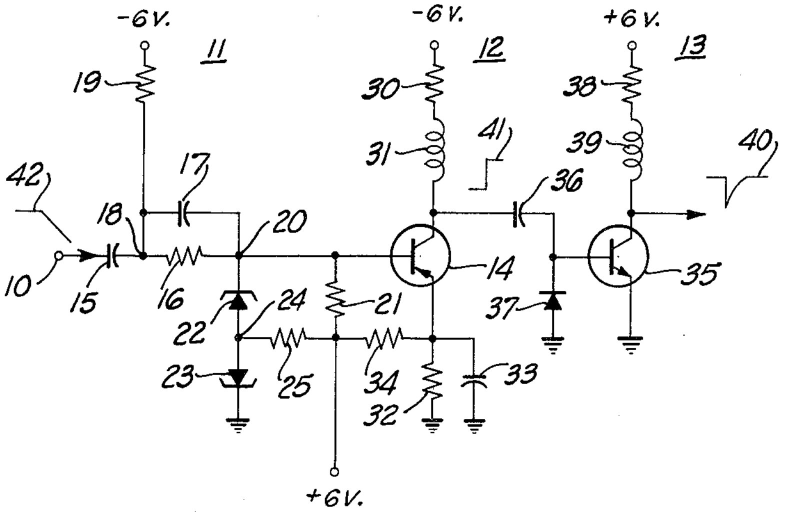

This invention relates to voltage wave shaping circuits and, in particular, to a new and novel wave shaping circuit operable over a wide frequency range.

Wave shaping and pulse shaping circuits are well known and widely used in electrical equipment to produce voltage signals with controlled wave forms for subsequent utilization. Problems are often encountered in the use of wave shaping circuits with input signals of varying wave forms and frequency rates, particularly where very sharp leading edges are required for the output. It is an object of the present invention to provide a new voltage wave shaping circuit for generating output voltages with uniform and very sharp leading edges from input signals which may vary over a wide frequency range and have a variety of wave forms. A particular object of the invention is to provide a voltage wave shaping circuit which utilizes the initial slope or leading edge of the input signal and one which operates independently of the peak value and duration of the input signal pulse. An additional object is to provide a voltage wave shaping circuit utilizing a transistor triggered by the input signal to provide an output voltage change with a very sharp leading edge.

It is a particular object of the invention to provide a voltage wave shaping circuit incorporating a pair of tunnel diodes connected in series and opposing polarity in the input portion of the circuit for controlling the switching of the transistor. A further object is to provide such a circuit in which one of the tunnel diodes is normally biased in the high voltage condition and the other is normally biased in the low voltage condition, with both diodes changing state for switching the transistor.

It is an object of the invention to provide a voltage wave shaping circuit for producing a sharp leading edge from a sloping voltage wave and incorporating a transistor amplifier, first circuit means for coupling an input terminal to the base of the transistor of the amplifier, first and second tunnel diodes connected in series and opposing polarity between the first circuit means and a reference potential, and bias means for biasing the transistor in the non-conducting condition and one of the tunnel diodes in the low voltage condition and the other of the tunnel diodes in the high voltage condition, whereby a voltage wave at the input terminal on reaching a pre-determined value switches the one tunnel diode to the high voltage condition and the other tunnel diode to the low voltage condition causing the transistor amplifier to turn on and generate a sharp edge voltage wave at the collector.

It is an object to provide such a voltage wave shaping circuit incorporating a differentiator circuit at the output for producing a voltage pulse with a sharp leading edge. Another object of the invention is to provide such a circuit incorporating an emitter follower between the tunnel diodes and the transistor amplifier.

The invention also comprises novel combinations and arrangements of components which will more fully appear in the course of the following description. The drawing merely shows and the description merely describes preferred embodiments of the present invention which are given by way of illustration or example.

Figure 2:
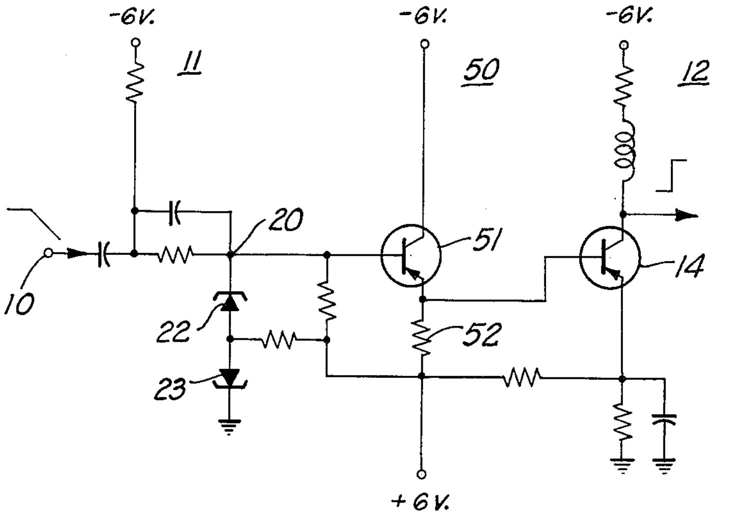

In the drawing:

FIG. 1 is a schematic diagram of a preferred form of the wave shaping circuit; and FIG. 2 is a schematic diagram of an alternative form of the circuit.

The circuit of FIG. 1 includes an input terminal 10, a tunnel diode section 11, a transistor amplifier 12, and a transistor differentiator 13. The input terminal 10 is connected to the base of transistor 14 of the transistor amplifier 12 via a coupling capacitor 15 and a resistor 16. A capacitor 17 is connected in parallel with the resistor 16. A negative voltage source is connected to the junction point 18 between the capacitor 15 and resistor 16 via another resistor 19. A positive voltage source is connected to the junction point 20 between the resistor 16 and the base of the transistor 14 via a resistor 21. The cathode of a tunnel diode 22 is connected to the junction point 20, with the anode of the tunnel diode 22 connected to the anode of another tunnel diode 23. The cathode of the tunnel diode 23 is connected to circuit ground. The positive voltage source is connected to the junction point 24 between the tunnel diodes via a resistor 25.

A resistor 30 and an inductor 31 are connected in series between a negative voltage source and the collector of the transistor 14. A resistor 32 and a capacitor 33 are connected in parallel between the emitter of the transistor 14 and circuit ground. The positive voltage source is connected to the emitter of the transistor 14 via a resistor 34.

The collector of the transistor 14 is coupled to the base of transistor 35 via capacitor 36. The base of the transistor 35 is connected to ground via a diode 37 and the emitter is connected directly to circuit ground. A resistor 38 and an inductor 39 are connected in series between a positive voltage source and the collector of the transistor 35, with the output appearing at the collector.

The transistor discriminator 13 is a conventional discriminator circuit and produces an output pulse 40 having a sharp leading edge and an exponential trailing edge from an input step voltage 41.

The transistor amplifier 12 is normally biased in the off or nonconducting condition and produces the step voltage 41 with a very sharp leading edge when switched to the conducting condition by application of appropriate voltage at the base. The positive voltage source via the resistor 34 provides a bias for the transistor amplifier.

The tunnel diode 22 is normally biased in the off or low voltage condition and the tunnel diode 23 is normally biased in the on or high voltage condition. The diodes are caused to switch by a negative going voltage 42 at the input terminal 10. The negative going input voltage has no effect on the circuit until a particular value of voltage is exceeded at which time the diode 22 is switched on and the diode 23 is switched off, producing a substantially instantaneous negative going change in voltage at the junction point 20 and hence at the base of the transistor 14, which change triggers the transistor into conduction.

The positive voltage source and the resistor 21 provide a bias for both tunnel diodes. The resistor 25 may be utilized to provide an additional bias for the diode 23 so that the diode 23 is switched off before the diode 22 is switched on, producing a more consistent operation of the circuit. The negative voltage source and the resistor 19 provide pre-biasing for both diodes 22 and 23 (in conjunction with the resistors 21 and 25) for the purpose of increasing the circuit sensitivity. The resistor 16 serves to provide a minimum load on the input signal source and determines the input voltage trigger point. The capacitor 17 provides a bypass at very high operating frequencies to improve high-frequency sensitivity.

In a typical circuit, the resistor 19 may be 820 ohms, the resistor 16, 220 ohms; the capacitor 17, 10 picofarads; the resistor 21, 5600 ohms; the resistor 25, 1300 ohms; the resistor 34, 330 ohms; the diodes 22, 23, type 1N3562; the transistor 14, type 2N976; the resistor 30, 220 ohms; the inductor 31, 1 microhenry; the resistor 32, 13 ohms; and the capacitor 33, 110 picofarads.

For this circuit, the junction point 20 will be about +.1 volt and the emitter of the transistor 14 will be about +.2 volt with the diode 22 and transistor 14 nonconducting and the diode 23 conducting. When a negative going voltage at the terminal 10 reaches about −1.5 volts, the diode 22 will be switched to the conducting or high-voltage state and the diode 23 will be switched to the nonconducting or low-voltage state. This will cause the voltage at the junction point 20 to change to about −.4 volt switching the transistor 14 to the conducting state.

With the specific circuit components described above, the shape of the output wave 41 typically is 1.5 nanoseconds per volt. The frequency of the input wave 42 over which the circuit will operate depends principally on the input capacitor 15 and the transistor types utilized. D.C. level detection is possible when the input is directly coupled. With capacitor 15 having a value 0.1 microfarad, the specific circuit described is operable over the frequency range of 50 kilocycles per second to 190 megacycles per second.

The specific circuit illustrated herein utilizes a pnp transistor in the amplifier and an npn type in the differentiator, operating with a negative going input voltage. Of course, the type of transistor can be changed and the polarity of the signals can be changed by suitable choice of polarities in the circuit. Also, the bias voltages in the circuit may be achieved by utilizing various biasing arrangements, the wave shaping circuit of the invention not being limited to the specific biasing circuits illustrated. A charge storage type diode could be used for diode 37 to improve shaping.

If desired, an emitter follower can be connected in circuit between the tunnel diode section 11 and the transistor amplifier 12, a typical emitter follower 50 being shown in FIG. 2. In this circuit, a transistor 51 has its base connected to the junction point 20, its collector connected to a negative voltage source, and its emitter connected to a positive voltage source via a resistor 52. The emitter is also directly connected to the base of the transistor 14 of the amplifier 12. The use of the emitter follower reduces the loading on the tunnel diodes and provides current gain in the circuit and may be utilized where the cost of the additional components is not a decisive factor.

The voltage wave shaping circuit of the invention provides an output with a very sharp leading edge while being operable with inputs of varying slopes and being independent of the actual magnitude and/or duration of input pulses. The circuit permits the utilization of a fairly high off bias on the transistor amplifier, reducing the possibility of triggering by spurious signals. The circuit reduces the dependence of operation on the peak current rating of tunnel diodes and hence permits the use of diodes with less peak current rating. A particularly significant advantage of the circuit lies in the fact that it operates equally well and produces the same sharp leading edge output with low frequency rate inputs and high frequency rate inputs.

Although exemplary embodiments of the invention have been disclosed and discussed, it will be understood that other applications of the invention are possible and that the embodiments disclosed may be subjected to various changes, modifications and substitutions without necessarily departing from the spirit of the invention.

I claim as my invention:

1. In a voltage wave shaping circuit for producing a sharp leading edge from a sloping voltage wave, the combination of:

a transistor amplifier;

an input terminal;

first circuit means for coupling said input terminal to the base of the transistor of said amplifier;

first and second tunnel diodes connected in series and opposing polarity between said first circuit means and a reference potential; and bias means for biasing said transistor in the nonconducting condition and one of said tunnel diodes in the low voltage condition and biasing the other of said tunnel diodes in the high voltage condition, whereby a voltage wave at said input terminal on reaching a predetermined value switches said one tunnel diode to the high voltage condition and said other tunnel diode to the low voltage condition causing said transistor amplifier to turn on and generate a sharp edge voltage wave at the collector.

2. In a voltage wave shaping circuit for producing a sharp leading edge from a sloping voltage wave, the combination of:

a transistor amplifier;

an input terminal;

first circuit means for coupling said input terminal to the base of the transistor of said amplifier and including an emitted follower between a junction point and said transistor base;

first and second tunnel diodes connected in series and opposing polarity between said junction point and a reference potential; and bias means for biasing said transistor in the nonconducting condition and one of said tunnel diodes in the low voltage condition and biasing the other of said tunnel diodes in the high voltage condition, whereby a voltage wave at said input terminal on reaching a predetermined value switches said one tunnel diode to the high voltage condition and said other tunnel diode to the low voltage condition causing said transistor amplifier to turn on and generate a sharp edge voltage wave at the collector.

3. In a voltage wave shaping circuit for producing a sharp leading edge from a sloping voltage wave, the combination of:

a transistor amplifier;

an input termial;

first circuit means for coupling said input terminal to the base of the transistor of said amplifier;

first and second tunnel diodes connected in series and opposing polarity between said transistor base and a reference potential; and bias means for biasing said transistor in the nonconducting condition and one of said tunnel diodes in the low voltage condition and biasing the other of said tunnel diodes in the high voltage condition, whereby a voltage wave at said input terminal on reaching a predetermined value switches said one tunnel diode to the high voltage condition and said other tunnel diode to the low voltage condition causing said transistor amplifier to turn on and generate a sharp edge voltage wave at the collector.

4. In a voltage wave shaping circuit for producing a sharp leading edge from a sloping voltage wave, the combination of:

a transistor amplifier;

an input terminal;

first circuit means for coupling said input terminal to the base of the transistor of said amplifier and including a resistance-capacitance parallel circuit connected in series between said input terminal and a junction point;

first and second tunnel diodes connected in series and opposing polarity between said junction point and a reference potential with said first tunnel diode adjacent said reference point; and bias means for biasing said transistor in the non-conducting condition and first tunnel diode in the low voltage condition and biasing said second tunnel diode in the high voltage condition, whereby a voltage wave at said input terminal on reaching a predetermined value switches said first tunnel diode to the high voltage condition and said second tunnel diode to the low voltage condition causing said transistor amplifier to turn on and generate a sharp edge voltage wave at the collector.

5. In a voltage wave shaping circuit for producing a sharp leading edge from a sloping voltage wave, the combination of:

a transistor amplifier;

an input terminal;

first circuit means for coupling said input terminal to the base of the transistor of said amplifier;

first and second tunnel diodes connected in series and opposing polarity between said first circuit means and a reference potential;

bias means for biasing said transistor in the non-conducting condition and one of said tunnel diodes in the low voltage condition and biasing the other of said tunnel diodes in the high voltage condition; and a differentiator circuit having the output of the collector of said amplifier as an input, whereby a voltage wave at said input terminal on reaching a predetermined value switches said one tunnel diode to the high voltage condition and said other tunnel diode to the low voltage condition causing said transistor amplifier to turn on generating a sharp edge voltage wave at said collector of said amplifier and a sharp edge voltage pulse at the output of said differentiator circuit.

6. In a voltage wave shaping circuit for producing a sharp leading edge from a sloping voltage wave, the combination of:

a transistor amplifier;

an input terminal;

first circuit means for coupling said input terminal to the base of the transistor of said amplifier and including a first resistor connected in series between first and second junction points;

a second resistor connected between said first junction point and a first voltage source of one polarity;

first and second tunnel diodes connected in series and opposing polarity between said second junction point and a reference potential;

a third resistor connected between said second junction point and a second voltage source of polarity opposite that of said first source; and a fourth resistor connected between said second source and the junction of said tunnel diodes with said transistor in the non-conducting condition and one of said tunnel diodes biased in the low voltage condition and the other of said tunnel diodes biased in the high voltage condition, whereby a voltage wave at said input terminal on reaching a predetermined value switches said one tunnel diode to the high voltage condition and said other tunnel diode to the low voltage condition causing said transistor amplifier to turn on and generate a sharp edge voltage wave at the collector.

References Cited by the Examiner

UNITED STATES PATENTS

| | | | |
|---|---|---|---|
| 2,614,140 | 10/1952 | Kreer | 307—88.5 |
| 3,040,190 | 6/1962 | Buelow | 307—88.5 |
| 3,116,424 | 12/1963 | Kaenel | 307—88.5 |

ARTHUR GAUSS, *Primary Examiner.*